United States Patent [19]

Simpson, Jr. et al.

[11] Patent Number: 5,130,509

[45] Date of Patent: Jul. 14, 1992

[54] APPARATUS FOR REFLOW SOLDERING

[76] Inventors: Raymond G. Simpson, Jr., 983 Paularaino Ave., Costa Mesa, Calif. 92626; Frederick L. Hillgert, 4809 River Ave., Newport Beach, Calif. 92663

[21] Appl. No.: 615,034

[22] Filed: Nov. 19, 1990

[51] Int. Cl.$^5$ .............................................. B23K 3/047
[52] U.S. Cl. .............................. 219/85.16; 219/85.18
[58] Field of Search ................ 219/85.16, 85.18, 85.19, 219/85.22, 110; 228/180.2, 212, 245

[56] References Cited

U.S. PATENT DOCUMENTS

| | | | |
|---|---|---|---|
| 2,332,368 | 10/1943 | Burtenshaw | 219/85.22 |
| 3,778,581 | 12/1973 | Denny | 219/110 |
| 4,220,845 | 9/1980 | Morreale | 219/85.19 |

FOREIGN PATENT DOCUMENTS 2311482  12/1976  France ............................ 219/85.16

*Primary Examiner*—Geoffrey S. Evans
*Attorney, Agent, or Firm*—Francis X. LoJacono

[57] ABSTRACT

A solder reflow apparatus for securing a plurality of aligned juxtaposed electronic components of various kinds to a solder-clad metal strip, wherein the substrate of the clad metal strip defines a conductive medium which is electrically heated to a proper temperature to allow the solder thereon to melt and reflow so as to cover the wire leads of each component as they lie across the solder-clad surface metal substrate. The apparatus comprises a base member having a pair of electrodes to which the metal-clad strip is releasably attached. A clamping framework is hingedly supported on the work surface of the base member and is arranged to be lowered over the lead wires of the electronic components that are in contact with the solder-clad surface of the substrate. Electric power is provided through the electrodes to the substrate by means of a suitable low voltage, high-current power supply having a timing system that establishes the proper melting temperature and timing to provide a perfect bonding between the components and the substrate material.

16 Claims, 2 Drawing Sheets

APPARATUS FOR REFLOW SOLDERING

BACKGROUND OF THE INVENTION

Field of the Invention

The present invention relates generally to an apparatus for reflow soldering and more particularly to a solder reflow apparatus that provides the use of a solder-clad substrate through which electrical current is passed at a suitable level and for a selective period of time so as to reach a given temperature that is high enough to achieve positive solder reflow between the conductive substrate and a plurality of electronic components which are held in contact with the conductive substrate material, whereby a sound structural and electrical bond is established between the substrate and each component mounted thereon.

Description of the Prior Art

As is well known in the art, various problems and difficulties are encountered in providing a suitable means of using reflow soldering by which a multiplicity of aligned and equally spaced electronic components are efficiently and satisfactorily secured to a workpiece.

Many types of reflow systems have been tried and suggested. Several systems have been successful but are limited to specific uses with specific components. Most known reflow soldering techniques or methods thereof are bound by various limitations that restrict their use in securing of in-line assemblage of electronic components.

The following are examples of known reflow soldering techniques:

LSI Reflow Solder System by Hughes Aircraft Co.

The LSI reflow solder system includes an electrically heated plate that is brought into contact with material to be soldered, the material being previously applied with solder so at to be heated for reflowing of the solder to achieve bonding.

U.S. Laser Corp.

ND:YAG Laser Reflow Solder System

This system includes a laser beam that is focused on the material to be soldered and laser (photon) energy is used to heat the material to a temperature to melt previously applied solder so as to establish a bond.

Many companies use various vapor-phase reflow soldering systems. Typically, the components to be soldered are placed on a conveyor belt and transported through an oven containing a hot vapor suitable to melt previously applied solder to achieve a bond.

OBJECTS AND ADVANTAGES OF THE INVENTION

It is an object of the present invention to provide an apparatus for securing a plurality of aligned juxtaposed electronic components, such as resistors, capacitors, diodes, inductors or wire leads, to a solder-clad metal strip, wherein the substrate of the clad metal strip defines a conductive medium whereby the substrate is electrically heated to a proper temperature to allow the solder thereon to melt and reflow to cover the wire leads of the components as they lie across the solder-clad surface of the electrically conductive metal substrate strip.

Another object of the invention is to provide a solder reflow apparatus that comprises a base member having a pair of electrodes located adjacent each side thereof to which a metal clad strip having a layer of solder thereon is releasably attached by means of toggle clamps. A clamping frame is hingedly supported on the base member and arranged to be lowered over a multiplicity of prearranged electronic components that are positioned with their leads in contact with the metal clad strip. When the leads of the components are secured to the metal clad strip, electric power is transferred through the electrodes into the substrate of the solder-clad strip by means of a suitable low-voltage, high-current power supply and a timing system that together provide for the proper melting temperature and timing to establish perfect bond of the components and the substrate material.

Still another object of the invention is to provide an apparatus of this character that has minimal moving parts which make it easy to operate, service and maintain.

It is still another object of the present invention to provide an apparatus of this character that is relatively inexpensive to manufacture and is simple but rugged in construction.

The characteristics and advantages of the invention are further sufficiently referred to in connection with the accompanying drawings, which represent one embodiment and, after considering this eample, skilled persons will understand that variations maybe made without departing from the principles disclosed; and we contemplate the employment of any structures, arrangements or modes of operation that are properly within the scope of the appended claims.

BRIEF DESCRIPTION OF THE DRAWING FIGURES

With the above and related objects in view, the invention consists in the details and construction and combination of parts, as will be more fully understood from the following description, when read in conjunction with the accompanying drawings and numbered parts, in which.

Figure 3:
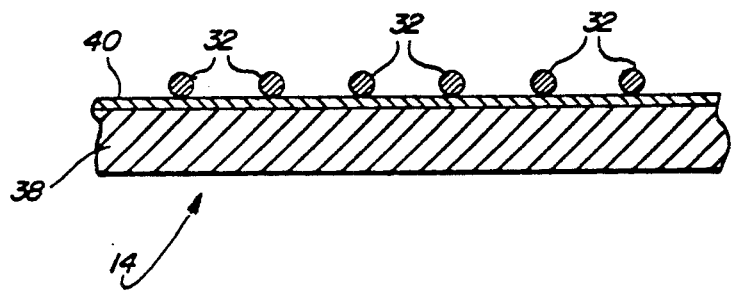
Figure 4:
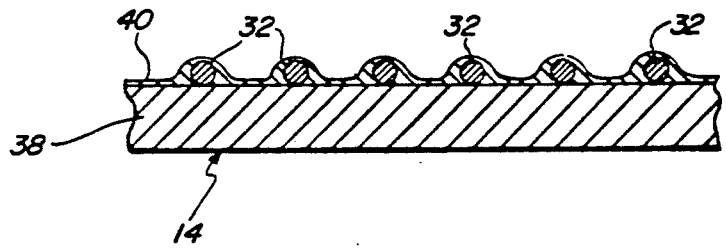

FIG. 3 is an enlarged cross-sectional view of a solder-clad metal strip showing the ambient temperature solder layered to an electrical conductive substrate and the lead wires of the electronic components positioned on the surface thereof; and FIG. 4 is an enlarged cross-sectional view of the solder-clad metal strip showing the heated (molten) solder forming fillets around the lead wires of the components and the surface of the substrate material.

DETAILED DESCRIPTION OF THE INVENTION

Figure 1:
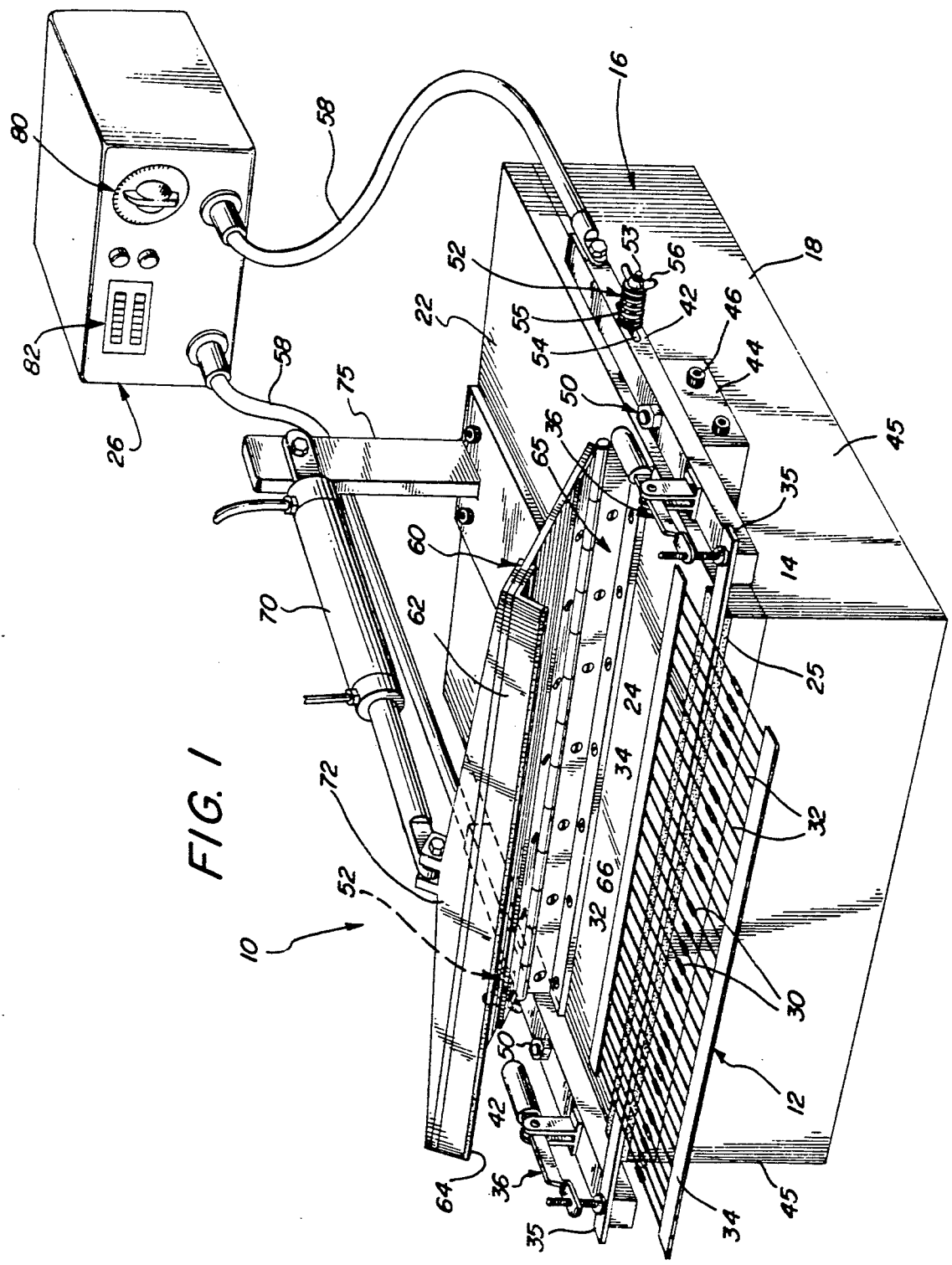
FIG. 1 is a pictorial view of the present invention which includes an apparatus for soldering a multiplicity of electronic components to a solder-clad metal strip and a power-supply means that controls the temperature and the timing thereof.
Figure 2:
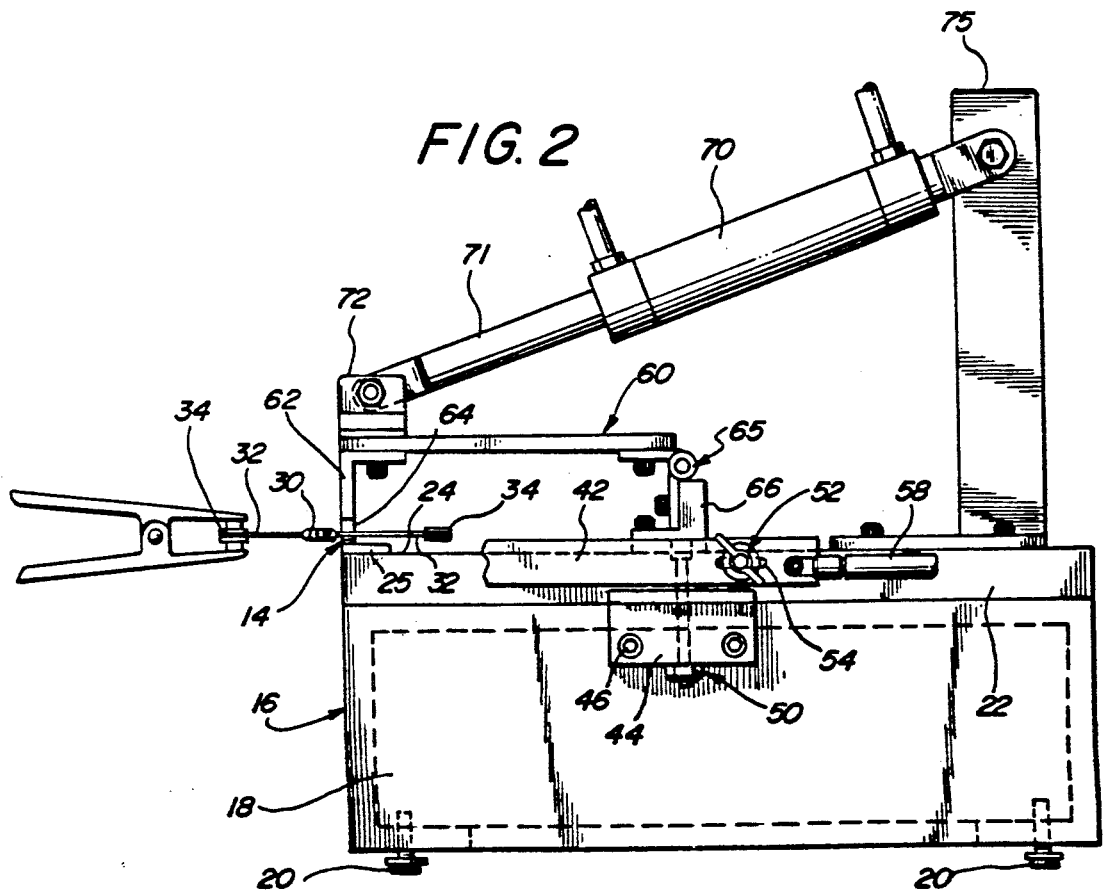
FIG. 2 is a side-elevational view if the apparatus for multiple soldering of electronic components showing the clamping frame member in a closed clamping position.

Referring more particularly to FIGS. 1 and 2, there is shown the preferred embodiment of the invention which is defined by a multiple soldering apparatus, generally indicated at 10, that is designed to solder a multiplicity of electronic components, which are designated at 12, to a solder-clad metal strip indicated at 14. The multiple soldering apparatus 10 comprises a support base 16 that includes a support structure 18 having adjustable legs 20 located on the underside thereof. The upper side is provided with a fixture plate 22 of suitable material, such as aluminum. The forward portion of fixture plate 22, adjacent the leading edge thereof, provides a work surface 24 on which is secure an elongated insulated band member 25 that extends the full length of fixture plate 22 and includes a width that covers a portion of the actual working area or surface 24 of fixture plate 22. Band 25 defines a means to support the solder-clad metal strip 14 and the aligned components 12 during the soldering operation thereof. Preferably, band member 25 consists of an insulation material such as silicon rubber. It should also understood that other suitable insulating materials may be used. Accordingly, both metal strip 14 and fixture plate 22 must be insulated from any electrical energy that is provided by a suitable power-supply means, such as indicated by numeral 26.

As illustrated in FIG. 1, the multiplicity of electronic components 12 are shown as resistors 30 having lead wires 32 aligned in parallel juxtaposed relation to each other. There are many types of component arrangements that are employed in the industry to meet various requirements and thus the arrangement as shown herein is for illustrative purposes only. These components ar supplied secured together in a spaced-apart order by means of masking tape 34 located at the opposite free ends of the lead wires 32.

In order to start the soldering process, solder-clad strip 14 is positioned over the full length of insulation band member 25 with the opposite free ends 35 of the strip being clamped in fixed position by clamping means, such as toggle clamps 36. This strip generally consists of a thin flat strip or wire metal 38 that defines a conductive substrate commonly formed from a metal that might include brass, copper or any of a number of suitable metals on which is plated a thin layer of solder material, designated at 40. The structure of the solder-clad strip 14 is more clearly illustrated in FIGS. 3 and 4. Each toggle clamp 36 is mounted adjacent one end of an electrode 42, which is itself mounted to a high-temperature insulating block 44. Thus, there are two electrodes and two insulting blocks which are mounted to the opposite sides 45 of support base 16 by means of screws 46. Each electrode is pivotally attached to the respective insulating blocks 46 by a pivot means 50 located approximately midway between the ends of the electrodes, as seen in both FIGS. 1 and 2, and is further provided with an adjustable biasing means, indicated at 52. Biasing means 52 is shown as comprising a threaded pin 53 that is affixed to fixture plate 22 and received through a slot 54 formed in electrode 42, whereby a spring 55 is mounted thereon by a wing nut 56 for the adjustment of tension that provides an inward force to the cable-connected end of electrode 42. The electrodes are each connected to the power supply 26 by cables 58. The spring tension applied to electrode 42 permits the wire strip 38 to expand and contract during the heating and cooling period of the process.

Once clad strip 14 and the group of components 12 are in place as indicated in FIG. 1, the components are then clamped in a secure fixed engagement with clad strip wire 14, as illustrated in FIG. 2. A securing means is provided which comprises a clamping structure or framework that is defined by a holding plate 60 having a downwardly formed longitudinal lip member 62, the longitudinal edge of lip member 62 being provided with a strip of insulation 64 which is preferably formed from silicon rubber. The opposite edge of holding plate 60 is hingedly attached to fixture plate 22 by a hinge means 65 which includes an elongated angle bar 66 secured to fixture plate 22. Holding plate 50 is adapted to be moved between a closed clamped position to an open position. This can be down manually, but is shown in the preferred arrangement by employing an actuating means shown herein as a pneumatic motor 70, the rod 71 thereof being attached at one end to a bracket 72 which is mounted to the forward portion of holding plate 60, and the motor housing 74 being mounted to a rear bracket 75 that is secured to the rear surface of fixture plate 22.

When holding plate is activated to a clamping position, electrical energy is sent through the electrodes 42, causing the substrate member 38 to heat to a temperature that is regulated and set by a power-control means 80 in the power-supply means 26, and by the proper timing provided by a timing means 82, whereby the thin layer of solder will melt and reflow so as to cover each lead wire 32 of each component 30 by forming fillets around them by combined capillary action and surface tension forces. This is illustrated in the enlarged cross-sectional view of FIG. 4 of the drawings. FIG. 3 illustrates lead wires 32 prior to being soldered to the substrate 38.

After the reflow soldering is completed, the holding plate 60 is raised and the bonded unit is removed by suitable means, such as a pony clamp.

It may thus be seen that the objects of the present invention set forth herein, as well as those made apparent from the foregoing description, are efficiently attained. While preferred embodiments of the invention have ben set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What we claim is:

1. A reflow soldering apparatus for soldering a multiplicity of electronic components to a substrate of a solder-clad metal strip or wire comprising:
   a support base having a work surface;
   a pair of electrodes mounted on each side of said support base;
   clamping means mounted on each of said electrodes wherein a solder-clad metal strip is clamped between said clamping means;
   means for holding down a multiplicity of electronic components in engagement with the solder-clad metal strip; and
   a power-supply means connected to said electrodes whereby electrical energy is provided to said electrodes, causing the reflow soldering to occur on the surface of the metal strip as a given temperature is established thereby.

2. A reflow soldering apparatus as recited in claim 1, wherein said apparatus includes means for activating said hold-down means between an open releasing position to a closed engaging position.

3. A reflow soldering apparatus as recited in claim 2, wherein said apparatus includes an insulating means positioned between said work surface and said hold-down means whereby said electronic components are held therebetween during the soldering of said components to said solder-clad metal strip.

4. A reflow soldering apparatus as recited in claim 3, wherein each of said electrodes is pivotally mounted to said support base by means of a respective insulating block.

5. A reflow soldering apparatus as recited in claim 4, including means for pivotally mounting each of said electrodes to each respective said insulating block and biasing means attached to said support base and each of said electrodes whereby the pivotal movement of each of said electrodes is controlled.

6. A reflow soldering apparatus as recited in claim 5, wherein said hold down means is hingedly connected to said work surface of said support base by a hinge means.

7. A reflow soldering apparatus as recited in claim 6, wherein said power-supply means includes timing means whereby proper timing is set for providing a given electrical energy to said electrodes.

8. A reflow soldering apparatus as recited in claim 7, said clamping means comprising a toggle clamp mounted adjacent the forward end of each of said electrodes so as to be located to receive the respective opposite free ends of said solder-clad metal strip.

9. A reflow soldering apparatus as recited in claim 8, wherein said solder-clad metal strip consists of an electrical conductive substrate and a layer of solder.

10. A reflow soldering apparatus as recited in claim 9, wherein said substrate consists of a flat metal strip.

11. A reflow soldering apparatus as recited in claim 9, wherein said substrate consists of a flat wire.

12. A reflow soldering apparatus in combination with a solder-clad metal strip for the soldering of a multiplicity of electronic components that are grouped together as a single unit so as to be secured to the solder-clad metal strip, wherein said combination comprises:

a solder-clad metal strip defined by a conductive substrate having a layer of solder clad to the surface thereof;

a reflow soldering apparatus including a power-supply means, and wherein said apparatus comprises:

a support structure including a support base and a fixture plate having a work surface;

a first electrode mounted adjacent to one side of said fixture plate and a second electrode mounted adjacent to the opposite side of said fixture plate so as to be insulated therefrom;

means for clamping said solder-clad metal strip to said fixture plate so as to be positioned over said work surface thereof;

a first insulating means mounted to said work surface whereby said substrate is positioned thereon;

a clamping framework hingedly mounted to said fixture plate;

a second insulating means mounted on said clamping framework and positioned thereon to engage the electronic components when place on said solder-clad surface of said substrate; and means for activating said clamping framework between an open and a closed position.

13. The combination as recited in claim 12, wherein each of said electrodes is pivotally mounted to said fixture plate by means of a respective insulating block and a pivot means whereby each of said electrodes is mounted so as to rotate horizontally, and each of said electrodes include adjustable biasing means whereby the rotational movement of each of said electrodes is under tension when said solder-clad metal strip is mounted to said clamping means.

14. The combination as recited in claim 13, wherein apparatus includes a power-supply means having timing means, and temperature control means.

15. The combination as recited in claim 14, wherein said clamping framework includes means for hinging said framework to said fixture plate.

16. The combination as recited in claim 15, wherein said activating means comprises a pneumatic motor.

* * * * *